(12) United States Patent
Brown et al.

(10) Patent No.: US 9,513,556 B2
(45) Date of Patent: Dec. 6, 2016

(54) METHOD AND SYSTEM OF PROCESS CHEMICAL TEMPERATURE CONTROL USING AN INJECTION NOZZLE

(71) Applicant: Tokyo Electron Limited, Tokyo (JP)

(72) Inventors: Ian J. Brown, Austin, TX (US); Wallace P. Printz, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 476 days.

(21) Appl. No.: 13/748,802

(22) Filed: Jan. 24, 2013

(65) Prior Publication Data

US 2014/0137892 A1 May 22, 2014

Related U.S. Application Data

(60) Provisional application No. 61/728,165, filed on Nov. 19, 2012.

(51) Int. Cl.
*H01L 21/311* (2006.01)
*G03F 7/42* (2006.01)

(52) U.S. Cl.
CPC .............. *G03F 7/42* (2013.01); *G03F 7/422* (2013.01); *G03F 7/423* (2013.01)

(58) Field of Classification Search
CPC .............. G03F 1/00; G03F 7/42; G03F 7/422; G03F 7/423
USPC ................................................... 134/18, 902
See application file for complete search history.

(56) References Cited

U.S. PATENT DOCUMENTS

| | | | |
|---|---|---|---|
| 6,378,534 B1* | 4/2002 | Olesen et al. | 134/1.3 |
| 7,819,984 B2 | 10/2010 | DeKraker et al. | |
| 2003/0045098 A1* | 3/2003 | Verhaverbeke et al. | 438/689 |
| 2004/0000322 A1* | 1/2004 | Verhaverbeke | 134/1.3 |
| 2007/0161248 A1* | 7/2007 | Christenson et al. | 438/689 |
| 2008/0283090 A1* | 11/2008 | DeKraker et al. | 134/3 |
| 2010/0326477 A1 | 12/2010 | DeKraker et al. | |
| 2013/0233343 A1* | 9/2013 | Brown | 134/3 |
| 2013/0233351 A1* | 9/2013 | Brown | 134/18 |

\* cited by examiner

*Primary Examiner* — Alexander Markoff
(74) *Attorney, Agent, or Firm* — Wood, Herron & Evans, LLP

(57) ABSTRACT

A method of process chemical temperature control for resist stripping of a substrate in a resist stripping system includes selecting at least two temperature control objectives and selecting at least two temperature control operating variables for optimization to achieve the at least two temperature control objectives. The method further includes injecting and mixing a first process chemical and a second process chemical into a treatment liquid delivery system of the resist stripping system, which forms a treatment liquid including an active species. The method further includes injecting vapor into the treatment liquid delivery system. The vapor is injected into the treatment liquid or the treatment liquid is injected into the vapor. Treatment liquid is dispensed from the dispensing device onto the substrate. At least two of the temperature control operating variables are adjusted in response to at least two metrology data values.

20 Claims, 3 Drawing Sheets

METHOD AND SYSTEM OF PROCESS CHEMICAL TEMPERATURE CONTROL USING AN INJECTION NOZZLE

CROSS-REFERENCE TO RELATED APPLICATIONS

Pursuant to 37 C.F.R. §1.78(a)(4), this application claims the benefit of and priority to prior filed Provisional Application Ser. No. 61/728,125 filed Nov. 19, 2012, which is expressly incorporated herein by reference.

FIELD OF THE INVENTION

This invention relates to methods for semiconductor processing, and more specifically relates to methods for improving the efficiency of photoresist stripping processes.

BACKGROUND OF THE INVENTION

The removal of photoresist coatings ("resist strip") is a critical process in semiconductor manufacturing and has historically been performed in a batch type processing mode with 25 to 100 wafers being immersed in a mixture of sulfuric acid and peroxide (SPM) for up to 20 minutes. As semiconductor devices shrink in size, defectivity is a significant challenge. To address the high defectivity associated with batch processing, industry focus has switched to developing and using single wafer type processes.

For many reasons, both economic and technical, single wafer SPM processes operate at higher temperatures (170°-220° C.) than batch processes (120°-150° C.). To make single wafer SPM processing economically feasible, the resist strip time must be reduced from 10 minutes to ideally less than 2 minutes. This can be achieved with the higher process temperatures.

High dose ion implant resist strip (HDIRS) is also a driving factor for high temperature single wafer SPM processing, as the crust created when the photoresist is bombarded by high-energy ions is notoriously difficult to remove. A key advantage for single wafer processing is that higher temperatures can be utilized to strip resist coatings. Higher process temperatures have been shown to significantly improve resist strip performance for higher dosed resists (e.g. $1 \times 10^{14}$ atoms/cm$^2$).

There are several difficulties that must be managed when using higher temperature SPM. For example, material selection for processing chamber materials is restricted to those that would be stable in contact with 220° C. SPM. Another concern is that significant silicon nitride and silicon dioxide film loss is measured at temperatures above 170° C. Typically, the process should strip photoresist without any loss of silicon nitride ($Si_3N_4$) or silicon dioxide ($SiO_2$).

Another complication is the high level of mist generation in the process chamber. This is a challenge to make multi-chemical processing possible. SPM processing is typically followed by a Standard Clean 1 (SC1) step to remove particles from the wafer. SC1 is a mixture of water, ammonium hydroxide and hydrogen peroxide, and any residual sulfuric acid mist in the chamber will react with ammonium hydroxide vapor emanating from the SC1 to form ammonium sulfate solid defects. Therefore, the presence of SPM mist during an SC1 process creates a defectivity challenge resulting from the two chemicals forming an undesirable precipitate that could be deposited on the wafer, e.g., $H_2SO_4 + NH_4OH = NH_4SO_4 + H_2O$.

Lastly, while efficient photoresist stripping rates necessitate elevated temperatures, the formation of Caro's acid is an endothermic reaction. This deprives the process of heat that is essential to high performance resist strip procedures. While it is possible to apply a heat source to the SPM as it is applied to a wafer (for example, externally applied steam), this tends to greatly increase sulfuric acid aerosols within the chamber. For the reasons explained in the paragraph above, this is highly detrimental to final component yield rates.

There is thus a need for an improved method of increasing the temperature of a process solution to improve photoresist stripping, while simultaneously reducing negative processing side effects.

SUMMARY OF THE INVENTION

The present invention provides a method of process chemical temperature control for resist stripping of a substrate in a resist stripping system. The method includes selecting at least two temperature control objectives that include a target dispense temperature and a target concentration of an active species, and selecting at least two temperature control operating variables for optimization to achieve the at least two temperature control objectives. The method further includes injecting a first process chemical into a treatment liquid delivery system of the resist stripping system. The first process chemical has a first temperature, a first flow rate, a first concentration, and a first flow direction. The treatment liquid delivery system has a mixing zone followed by a reaction zone, followed by a dispensing device. The method also includes injecting a second process chemical into the treatment liquid delivery system. The second process chemical has a second temperature, a second flow rate, a second concentration, and a second flow direction. The first process chemical is mixed with the second process chemical in the mixing zone at a ratio of the first process chemical to the second process chemical, which forms a treatment liquid including the active species, and the treatment liquid then flows to the dispensing device in a treatment liquid flow direction. The method further includes injecting vapor into the treatment liquid delivery system at a vapor temperature, a vapor flow rate, a vapor pressure, and a vapor flow direction. The vapor is injected into the treatment liquid or the treatment liquid is injected into the vapor at or adjacent to an end of the reaction zone. After injecting, treatment liquid is dispensed from the dispensing device onto the substrate at a dispense temperature and a dispense pressure. At least two of the temperature control operating variables are adjusted in response to at least two metrology data values measured for the resist stripping system, where the at least two temperature control operating variables are selected from the first temperature, the first flow rate, the first concentration, the second temperature, the second flow rate, the second concentration, the ratio of first chemical to the second chemical, the vapor temperature, the vapor flow rate, and the vapor pressure.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
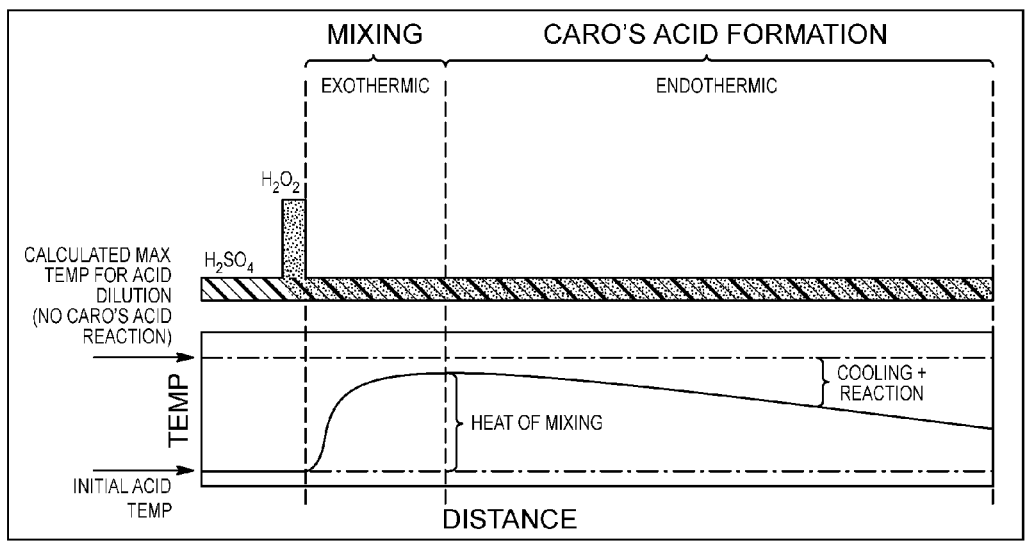
FIG. 1 is a diagram depicting the reaction of sulfuric acid and hydrogen peroxide into Caro's acid.

While the embodiments of the claimed invention relate to methods for controlling the temperature of process chemicals used to remove photoresist coatings from substrates, it is instructive to discuss the chemical reactions involving one well known combination of process chemicals; Sulfuric Acid Peroxide Mixture (SPM). FIG. 1 is a schematic illustrating the processes that occur during and after injection of hydrogen peroxide into sulfuric acid. Rapid mixing of hydrogen peroxide into sulfuric acid is important to achieve high yield conversion of hydrogen peroxide into Caro's acid, which is necessary for efficient and rapid removal of photoresist. Additionally, rapid injection and complete mixing of hydrogen peroxide into sulfuric acid provides more time (and consequently higher conversion) for the chemical reaction between hydrogen peroxide and sulfuric acid to form Caro's acid prior to dispensing onto the resist coated substrate. However, as seen in FIG. 1, once the two chemicals are mixed, the formation of Caro's acid is an endothermic process. Photoresist strip rates are very sensitive to temperature changes, so the endothermic production of Caro's acid has a negative impact on stripping performance. As also seen in FIG. 1, Caro's acid will not form above a calculated maximum temperature. Therefore, the endothermic reaction cannot be ameliorated by simply starting with arbitrarily high acid and peroxide temperatures, since no Caro's acid will form. Embodiments of the present invention provide methods for photoresist strip temperature control, while reducing negative side effects that are present when controlling temperature by other means.

Figure 2:
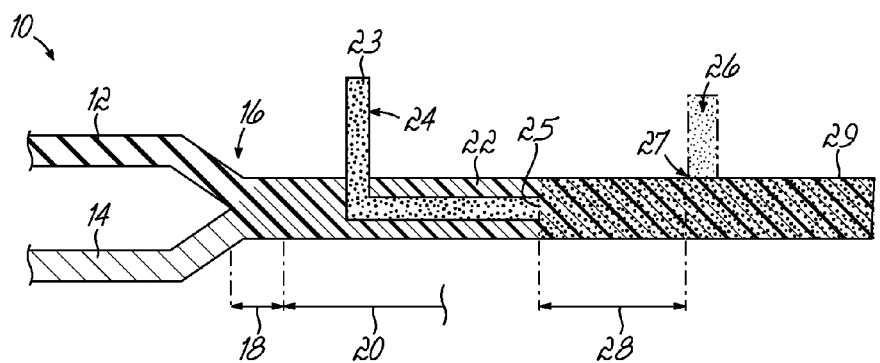
FIG. 2 is a cross sectional view of an embodiment of the invention.

In the discussion that follows, exemplary methods will use sulfuric acid and hydrogen peroxide, but it will be apparent to one of ordinary skill in the art that the embodiments of the invention may be performed with other process chemicals. Additionally, examples will include introduction of water vapor (steam) or sulfuric acid vapor, but other vapors may provide acceptable results depending on processing objectives. FIG. 2 shows a treatment liquid delivery system 10 of a resist stripping system (not shown). The resist stripping system may be used in conjunction with a processing chamber or other semiconductor processing tools. The delivery system 10 includes a first process chemical and associated conduit 12 and a second process chemical and associated conduit 14 that are injected and combined at a junction 16. The junction 16 may be of the t-type, y-type, coaxial, or other suitable geometries known to the art. While the depicted examples will be limited to two process chemicals (and associated conduits), it should be noted that the embodiments of the present invention may accommodate a variable number of process chemicals. The junction 16 is preferably designed to mix the first process chemical 12 and the second process chemical 14 rapidly and efficiently. The junction 16 transitions into a mixing zone 18 and a reaction zone 20 thereafter. The reaction zone 20 is shown as having indeterminate length in the figure, because the identity of the first process chemical 12 and the second process chemical 14, as well as system configuration variables, will impact the distance required to fully react the combined chemicals. By way of example, the first process chemical 12 could be sulfuric acid and the second process chemical 14 could be hydrogen peroxide. In certain embodiments, the sulfuric acid solution has a weight percentage from about 70 to about 98, and the hydrogen peroxide solution has a weight percentage from about 10 to about 30. In other embodiments, the sulfuric acid solution has a weight percentage of about 98 and the hydrogen peroxide solution has a weight percentage of about 30. The reaction zone 20 is defined by the length required to fully react the combined chemicals into Caro's acid. The first process chemical 12 has a first temperature, a first flow rate, a first concentration, and a first direction. The second process chemical 14 has a second temperature, a second flow rate, a second concentration, and a second direction. The system parameters include a ratio of the first process chemical to the second process chemical fed to the mixing zone 18.

Once the first process chemical 12 and the second process chemical 14 have combined and reacted, they form a treatment liquid 22 having a treatment liquid direction. In this example designating the first process chemical 12 as sulfuric acid and the second process chemical 14 as hydrogen peroxide, the treatment liquid 22 would be SPM. Because of the endothermic reaction described above, the treatment liquid 22 will be too cool to effectively strip photoresist from the substrate. Therefore, in accordance with an embodiment of the invention, vapor 23 is injected into the delivery system 10 with a vapor injection device 24. In some embodiments, the vapor 23 is injected with a pressure from about 114 psi to about 576 psi. The vapor 23 exits the vapor injection device 24 at an injection point 25. The vapor 23 has a vapor composition, a vapor temperature, a vapor flow rate, a vapor pressure, and a vapor flow direction. In one embodiment, the vapor composition is steam. In another embodiment, the vapor composition is sulfuric acid. In some embodiments, ozone 26 may be introduced at an ozone injection point 27 that is disposed at a separation distance 28 from the injection point 25, i.e., downstream of the injection point 25.

In an exemplary embodiment, the direction of the vapor 23 is the same as the treatment liquid direction at the injection point 25 to ensure that any pressure increase is directed toward the open end of the delivery system 10, or toward the dispensing device 29 (described in more detail below). This ensures that any pressure generated by the vapor 23 is permitted to escape safely. To further assist in heat transfer, the vapor 23 may be coaxially injected into the center of the flow of the treatment liquid 22. Center injection is also beneficial when treatment liquid 22 is injected into the center of the flow of vapor 23 (as will be described in more detail below). To help retain pressure in the vapor, an orifice or restriction port (not shown) may be used at the injection point 25 where the vapor 23 is injected into the treatment liquid 22.

The injection point 25 may be situated at a location at or adjacent the end of the reaction zone 20. This location is advantageous for two reasons. First, introducing the vapor 23 internally, versus externally to the delivery system 10, reduces aerosolized sulfuric acid within the chamber. Reducing sulfuric acid residue reduces defects caused by interaction with subsequent process chemicals. Secondly, since the maximum quantity of Caro's acid has been reacted at the end of the reaction zone 20, introduction of heat will not have any deleterious impact on the treatment liquid 22. The amount of Caro's acid available in the treatment liquid 22 for stripping may be referred to as the concentration of the active species. Of course, the identity and desired concentration of the active species will vary as a function of the first process chemical 12 and the second process chemical 14.

Once the treatment liquid 22 is at an appropriate temperature, it exits the delivery system 10 through a dispensing device 29. The treatment liquid 22 exiting the dispensing device 29 has a dispense temperature and a dispense pressure. The dispensing device 29 may use a structure with a constant cross sectional area, as shown in FIG. 2, or it may be of a flared configuration, as seen by the dispensing device 29a in FIG. 3. The flared configuration may be used to reduce the dispense pressure of the treatment liquid 22 as it exits the dispensing device 29a. The flared end of the dispensing device 29a allows for radial expansion of the vapor 23, and therefore results in decreased pressure directed linearly out of the dispensing device 29a.

Figure 3:
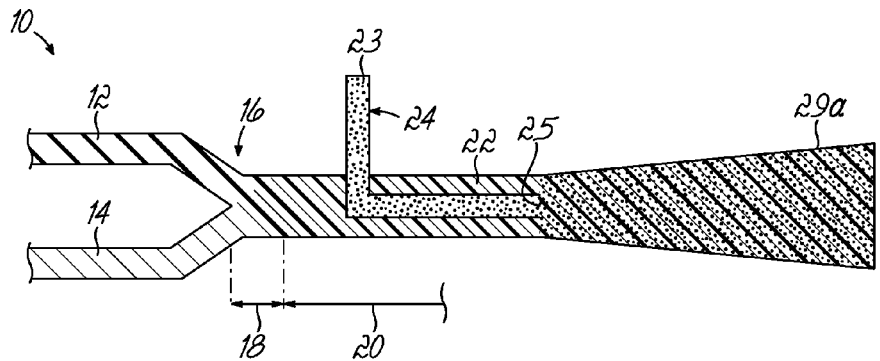
FIG. 3 is a cross sectional view of an embodiment of the invention including a flared dispensing device.
Figure 4:
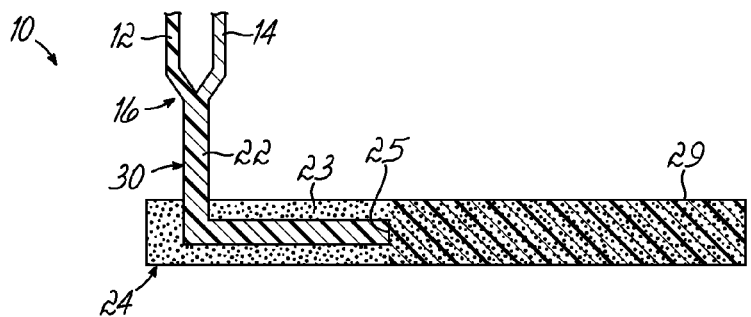
FIG. 4 is a cross sectional view of an embodiment of the invention wherein treatment liquid is injected into vapor.
Figure 5:
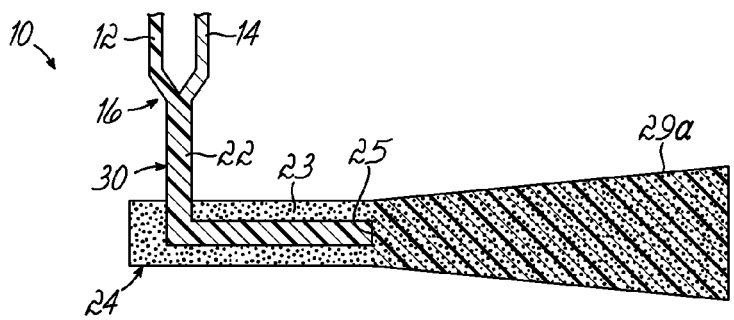
FIG. 5 is a cross sectional view of an embodiment of the invention as in FIG. 4, including a flared dispensing device.
Figure 6:
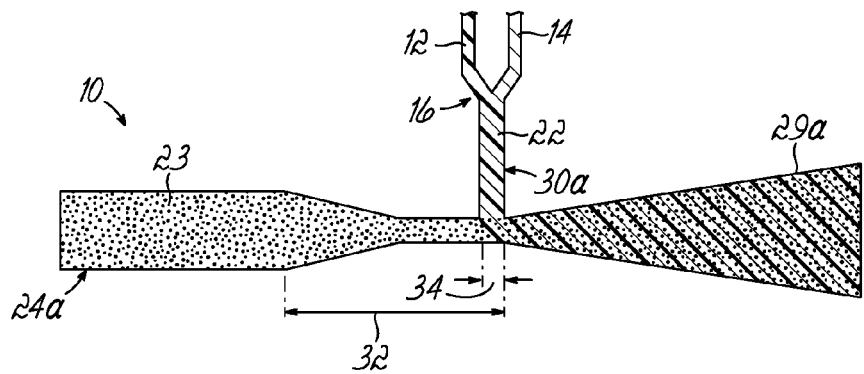
FIG. 6 is a cross sectional view of an embodiment of the invention including a venturi with treatment liquid being introduced at a low pressure point.
Figure 7:
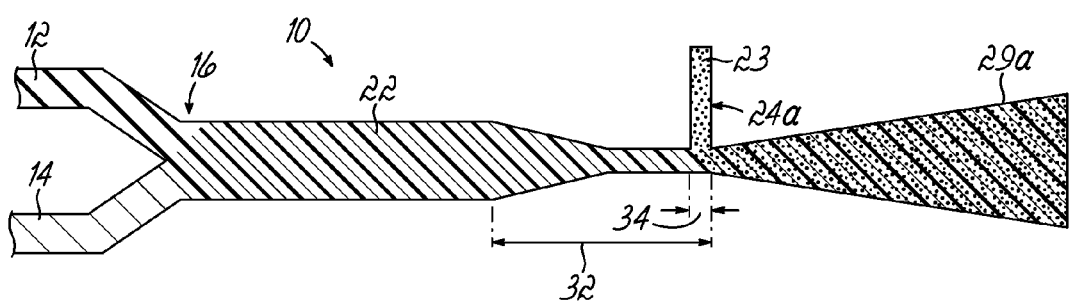
FIG. 7 is a cross sectional view of an embodiment of the invention including a venturi with vapor being introduced at a low pressure point.

Various other embodiments of the delivery system 10 may accommodate different photoresist stripping environments. For example, the injection of vapor 23 into the treatment liquid 22 as shown in FIGS. 2 and 3 may be reversed so that the treatment liquid 22 is injected into the vapor 23 by using a treatment liquid injection device 30 (FIG. 4) (in this example, an SPM injection device). This can be seen, with both varieties of dispensing device 29 and 29a, in FIGS. 3 and 4, respectively. Additionally, a venturi 32 may advantageously provide a low pressure point 34 for the introduction of treatment liquid 22 into vapor 23 or vapor 23 into treatment liquid 22, shown in FIGS. 6 and 7, respectively. Vapor 23 may be introduced into the venturi 32 by way of a venturi vapor injection device 24a, and treatment liquid 22 may be introduced into the venturi 32 by way of a venturi treatment liquid injection device 30a.

In FIGS. 2-5, the injection of the vapor 23 into the flow of treatment liquid 22, or conversely the treatment liquid 22 into the flow of vapor 23, is shown with the flow directions being the same at the injection point 25. When using a venturi 32, the injection is depicted as perpendicular. In all embodiments, the injection may occur at an angle of 0-90° to the direction of flow. Same direction injection (0°), as described above, ensures that any pressure increase is directed toward the dispensing device 29. Angles of greater than 0° and up to 90° minimize the possibility of pressure increases being directed back toward the mixing zone 18. At 90°, the coupling of the injection device into the main flow is simplified by a T-junction design. The coupling with lesser non-zero angles may be more complex, but such angles are nonetheless contemplated, although not specifically depicted herein. Angles greater than 90° would create potential for pressure increases to be directed in the opposite direction from that desired in the present invention.

Portions of the delivery system 10 that come in contact with the mixed first process chemical 12 and second process chemical 14 may be constructed of perfluoroalkoxy ("PFA") or may be coated with PFA. PFA may be obtained from the Du Pont Corporation under the Teflon® series of fluoropolymers. Alternatively, quartz material may be used, and other suitable inert compositions or inert coatings may produce acceptable results. As will be appreciated by one of ordinary skill in the art, the selected first process chemical 12 and selected second process chemical 14 will dictate the range of non-reactive contact surfaces that may be used. Portions of the delivery system 10 delivering vapor 23 may include stainless steel, ethylene-tetrafluoroethylene lined stainless steel, tantalum, titanium, or PFA coated stainless steel. Ethylene-tetrafluoroethylene may be obtained from the Du Pont Corporation under the Tefzel® series of fluoropolymers. Depending upon the reactivity of the selected vapor 23, other materials may be appropriate. As with previous examples, the particular geometry of the dispensing device 29 may depart from the shape depicted in FIGS. 6 and 7.

To augment or replace the temperature adjustment provided by the injection of vapor 23, other heating sources may be used. For example, an infrared ("IR") energy source (e.g., filtered incandescent lamp, LED array, etc.) may be used to heat the treatment liquid 22. If IR sources are used, portions of the delivery system 10 must be fabricated from a suitable IR-transparent material. A solid element heating source, such as an immersible resistive heater, may be used to heat the treatment liquid 22 before it exits the dispensing device 29.

Figure 8:
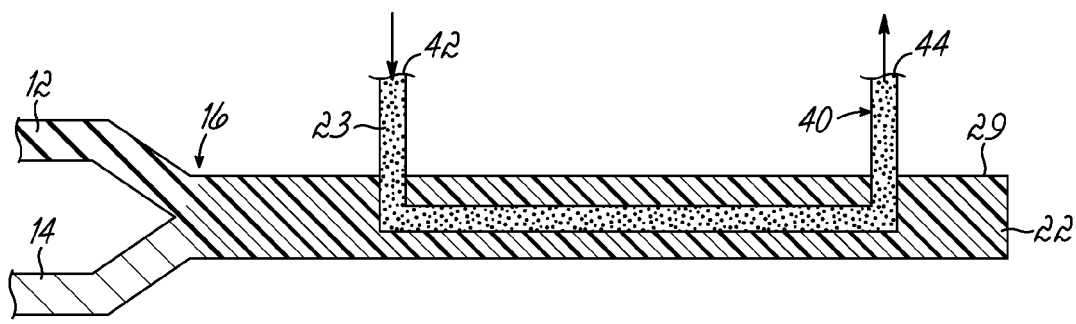
FIG. 8 is a cross sectional view of an embodiment of the invention including a heat exchanger.

One potential limitation associated with using steam as the vapor 23 is dilution of the treatment liquid 22 once the steam condenses. This potentially negative side effect may be mitigated in a variety of ways. As seen in FIG. 8, steam (vapor 23) may be confined within a heat exchanger 40, shown as a heat exchange conduit, that is disposed within the delivery system 10 and is in contact with the treatment liquid 22. As the steam passes into the inlet 42 and out from the outlet 44 of the heat exchanger 40, heat is conducted through the walls of the heat exchanger 40 into the treatment liquid 22. Since the steam never comes in contact with the treatment liquid 22, no dilution occurs. In the alternative, as applied to the SPM embodiment, steam may be replaced with sulfuric acid vapor. In some embodiments, the volume of the first process chemical 12 (sulfuric acid liquid) is reduced to compensate for the amount of sulfuric acid vapor 23 that will condense after being injected into the treatment liquid 22. Therefore, the solution is "diluted" with a process chemical itself, and there is no reduction in the strength of the treatment liquid 22.

In use, the two most critical variables that impact photoresist strip performance are the target dispense temperature and the target concentration of the active species. These two variables may be referred to as temperature control objectives. Generally, a high temperature treatment liquid 22 having a high concentration of Caro's acid (a high concentration of the active species) will be necessary for effective resist stripping. In some embodiments, the target dispense temperature is from about 120° C. to about 250° C. Variables that may be adjusted to achieve the temperature control objectives include the first temperature, the first flow rate, the first concentration, the second temperature, the second flow rate, the second concentration, the ratio of first chemical to the second chemical, the vapor temperature, the vapor flow rate, and the vapor pressure. These variables may be referred to as the temperature control operating variables.

The temperature control operating variable may be adjusted in response to metrology data measured by sensors (not shown) of the resist stripping system with which the delivery system 10 is used. By way of example, the sensor may report thickness of resist present, thickness of resist removed, mass of resist present, mass of resist removed, duration of the strip process, dispense temperature, or concentration of the active species. It should be noted that the "concentration of the active species" is the actual concentration of the active species, as contrasted with the target concentration of the active species. The same distinction holds true with the dispense temperature. The "dispense temperature" is the actual temperature of the treatment liquid 22 as contrasted with the target dispense temperature.

Figure 9:
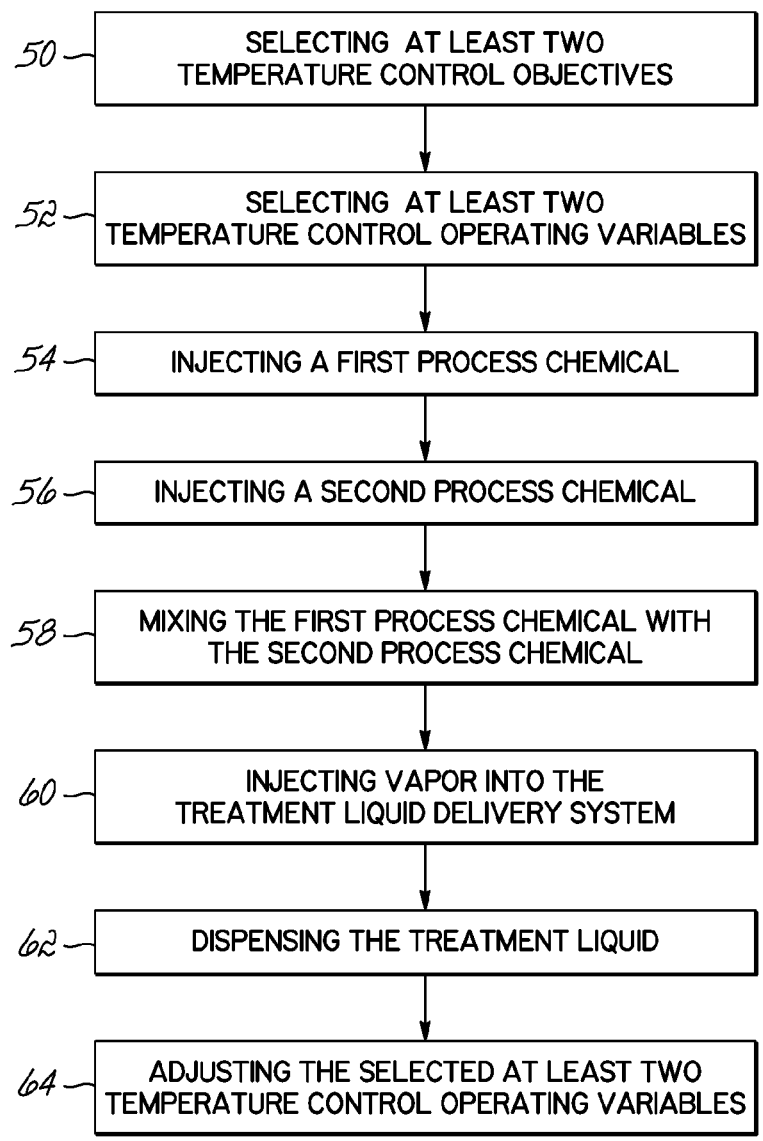
FIG. 9 is a flowchart depicting a method of process chemical temperature control.

The structures and assemblies described above may be used to perform a method of controlling the process chemical temperature for stripping of a substrate in a resist stripping system, as shown by the flowchart in FIG. 9. In 50, the method includes selecting at least two temperature control objectives that include a target dispense temperature and a target concentration of an active species. In 52, the method also includes selecting at least two temperature control operating variables for optimization to achieve the at least two temperature control objectives. In 54, the method further includes injecting a first process chemical into a treatment liquid delivery system of the resist stripping system. The first process chemical has a first temperature, a first flow rate, a first concentration, and a first flow direction. The treatment liquid delivery system has a mixing zone followed by a reaction zone, followed by a dispensing device. In 56, the method also includes injecting a second process chemical into the treatment liquid delivery system. The second process chemical has a second temperature, a second flow rate, a second concentration, and a second flow direction.

In 58, the method also includes mixing the first process chemical with the second process chemical in the mixing zone at a ratio of the first process chemical to the second process chemical, which forms a treatment liquid including the active species and flowing the treatment liquid to the dispensing device in a treatment liquid flow direction. In 60, the method further includes injecting vapor into the treatment liquid delivery system at a vapor temperature, a vapor flow rate, a vapor pressure, and a vapor flow direction. The vapor is injected into the treatment liquid or the treatment liquid is injected into the vapor at or adjacent to an end of the reaction zone. At 62, the method includes dispensing the treatment liquid from the dispensing device onto the substrate at a dispense temperature and a dispense pressure. At 64, at least two of the temperature control operating variables are adjusted in response to at least two metrology data values measured for the resist stripping system. At least two temperature control operating variables include the first temperature, the first flow rate, the first concentration, the second temperature, the second flow rate, the second concentration, the ratio of first chemical to the second chemical, the vapor temperature, the vapor flow rate, and the vapor pressure.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of process chemical temperature control for a strip process in a resist stripping system, the method comprising:

selecting at least two process control objectives from a target thickness of resist present, a target thickness of resist removed, a target mass of resist present, a target mass of resist removed, a target duration of the strip process, a target dispense temperature, and a target concentration of an active species, wherein the at least two process control objectives include at least the target dispense temperature and the target concentration of the active species;

selecting at least two process control operating variables for optimization to achieve the at least two process control objectives;

injecting a first process chemical into a treatment liquid delivery system of the resist stripping system, wherein the first process chemical is at a first temperature, a first flow rate, a first concentration, and a first flow direction, the treatment liquid delivery system having a mixing zone followed by a reaction zone, followed by a dispensing device coupled to a process chamber containing a substrate;

injecting a second process chemical into the treatment liquid delivery system, wherein the second process chemical is at a second temperature, a second flow rate, a second concentration, and a second flow direction;

mixing the first process chemical with the second process chemical in the mixing zone at a ratio of the first process chemical to the second process chemical and forming a treatment liquid comprising the active species and flowing the treatment liquid to the dispensing device in a treatment liquid flow direction;

introducing a flow of vapor into the treatment liquid delivery system at a vapor temperature, a vapor flow rate, a vapor pressure, and a vapor flow direction, wherein the introducing includes a) the flow of vapor being injected into the flow of the treatment liquid, b) the flow of the treatment liquid being injected into the flow of vapor, or c) the flow of vapor being confined within a heat exchange conduit positioned within the flow of the treatment liquid, and wherein the introducing is at or adjacent to an end of the reaction zone;

after introducing the flow of vapor, dispensing the treatment liquid from the dispensing device into the process chamber and onto the substrate at a dispense temperature and dispense pressure;

measuring at least two metrology data values for the resist stripping system from an actual thickness of resist present, an actual thickness of resist removed, an actual mass of resist present, an actual mass of resist removed, an actual duration of the strip process, an actual dispense temperature, and an actual concentration of the active species, wherein the at least two metrology data values include at least the actual concentration of the active species and the actual dispense temperature;

adjusting the selected at least two process control operating variables in response to the at least two metrology data values measured to achieve the at least two process control objectives, wherein the at least two process control operating variables are selected from the first temperature, the first flow rate, the first concentration, the second temperature, the second flow rate, the second concentration, the ratio of first chemical to the second chemical, the vapor temperature, the vapor flow rate, and the vapor pressure.

2. The method of claim 1 wherein portions of the treatment liquid delivery system in contact with the mixed first and second process chemical are constructed of perfluoroalkoxy (PFA), coated with PFA, or are constructed of quartz.

3. The method of claim 1 wherein portions of the treatment liquid delivery system in contact with the vapor are made of stainless steel, ethylene-tetrafluoroethylene lined stainless steel, tantalum, titanium, or perfluoroalkoxy (PFA) coated stainless steel.

4. The method of claim 1 wherein the dispensing device is constructed with infrared transparent material and is heated with infrared light to raise the dispense temperature of the treatment liquid.

5. The method of claim 1 wherein the treatment liquid is heated using a solid element heater.

6. The method of claim 1 wherein the first process chemical is a sulfuric acid solution, the second process chemical is a hydrogen peroxide solution, and the treatment liquid is a sulfuric acid peroxide mixture (SPM).

7. The method of claim 6 wherein the vapor is steam.

8. The method of claim 7 wherein the flow of vapor is injected using a vapor injection device into the flow of SPM the treatment liquid with the vapor flow direction being the same as the treatment liquid flow direction.

9. The method of claim 8 wherein the vapor injection device injects the flow of the vapor in the center of the flow of the treatment liquid.

10. The method of claim 7 wherein the flow of the treatment liquid is injected using an SPM injection device into the center of the flow of vapor with the same treatment liquid flow direction as the vapor flow direction.

11. The method of claim 7 wherein the flow of vapor is injected through an orifice of a vapor injection device into the flow of the treatment liquid with the vapor flow direction being substantially perpendicular to the treatment liquid flow direction at a vapor injection point adjacent the orifice.

12. The method of claim 7 wherein the flow of vapor is introduced by confining the flow of vapor within the heat exchange conduit to allow heat of the vapor to raise the temperature of the treatment liquid flowing passed the heat exchange conduit through conduction without decreasing the first concentration or the second concentration of the treatment liquid.

13. The method of claim 7 wherein the dispensing device is flared whereby the dispensing is at a reduced dispense pressure.

14. The method of claim 7 wherein the vapor flows through a venturi and the flow of the treatment liquid is injected at a low pressure point of the venturi.

15. The method of claim 7 wherein the treatment liquid flows through a venturi and the flow of vapor is injected at the low pressure point of the venturi.

16. The method of claim 7 wherein ozone is injected at an ozone injection point downstream of a vapor injection point.

17. The method of claim 7 wherein the vapor flow rate is operably controlled to ensure a supply of vapor sufficient to achieve the target dispense temperature.

18. The method of claim 7 wherein the target dispense temperature is from about 120° C. to about 250° C.

19. The method of claim 7 wherein the vapor pressure is in a range from 114 psi to 576 psi.

20. The method of claim 6, wherein the vapor is sulfuric acid vapor.

* * * * *

UNITED STATES PATENT AND TRADEMARK OFFICE
CERTIFICATE OF CORRECTION

| | | |
|---|---|---|
| PATENT NO. | : 9,513,556 B2 | Page 1 of 1 |
| APPLICATION NO. | : 13/748802 | |
| DATED | : December 6, 2016 | |
| INVENTOR(S) | : Brown et al. | |

It is certified that error appears in the above-identified patent and that said Letters Patent is hereby corrected as shown below:

In the Claims

Column 9, Lines 20-21, Claim 8, delete "vapor injection device into the flow of SPM the treatment" and insert --vapor injection device into the flow of the treatment--.

Column 10, Line 7, Claim 12, delete "treatment liquid flowing passed the heat" and insert --treatment liquid flowing past the heat--.

Signed and Sealed this
Twenty-eighth Day of March, 2017

Michelle K. Lee
*Director of the United States Patent and Trademark Office*